United States Patent [19]

Kane

[11] Patent Number: 4,663,188

[45] Date of Patent: May 5, 1987

[54] METHOD FOR MAKING A PHOTODETECTOR WITH ENHANCED LIGHT ABSORPTION

[75] Inventor: James Kane, Lawrenceville, N.J.

[73] Assignee: RCA Corporation, Princeton, N.J.

[21] Appl. No.: 735,340

[22] Filed: May 17, 1985

Related U.S. Application Data

[62] Division of Ser. No. 424,137, Sep. 27, 1982, Pat. No. 4,532,537.

[51] Int. Cl.$^4$ ............................................ H01L 31/18
[52] U.S. Cl. .......................................... 427/74; 427/75; 427/109
[58] Field of Search ............... 427/74, 75, 109, 126.3, 427/225.3; 136/249 TJ, 256, 258 AM, 259

[56] References Cited

U.S. PATENT DOCUMENTS

| | | | |
|---|---|---|---|
| 3,107,177 | 10/1963 | Saunders et al. | 427/110 |
| 3,480,473 | 11/1969 | Tanos | 427/74 |
| 3,677,814 | 7/1972 | Gillery | 427/108 |
| 4,064,521 | 12/1977 | Carlson | 357/2 |
| 4,072,541 | 2/1978 | Meulenberg et al. | 136/255 |
| 4,109,271 | 8/1978 | Pankove | 357/30 |
| 4,147,564 | 4/1979 | Magee et al. | 148/1.5 |
| 4,162,928 | 7/1979 | Shepard, Jr. | 138/246 |
| 4,239,810 | 12/1980 | Alameddine et al. | 427/75 |
| 4,252,865 | 2/1981 | Gilbert et al. | 428/611 |
| 4,265,974 | 5/1981 | Gordon | 428/432 |
| 4,377,728 | 3/1983 | Dalal | 136/249 |
| 4,497,974 | 2/1985 | Deckman et al. | 136/259 |
| 4,500,743 | 2/1985 | Hayashi et al. | 136/258 AM |

FOREIGN PATENT DOCUMENTS

| 3023165 | 1/1982 | Fed. Rep. of Germany | 136/251 |
|---|---|---|---|
| 57-49278 | 3/1982 | Japan | 136/259 |

OTHER PUBLICATIONS

H. Iida et al., *IEEE Electron Device Letters*, vol. EDL-3, p. 114, (1982).
E. Yablonovitch et al., *IEEE Transactions on Electron Devices*, vol. ED—29, p. 300, (1982).
R. Muto et al., *Oyo Buturi*, vol. 41, p. 1, (1982), (translation only).
J. Kane et al., *J. Electrochemical Society* 123, 270, (1976).
J. Kane et al., *Thin Solid Films* 29, 155, (1975).
R. Gordon, SERI Final Contract Report, Contract No. SERI—XS—Zero—9318—1, (Sep. 1981).
Muller, *IEEE Transactions on Electron Devices*, vol. ED—25, No. 2, Feb. 1978, pp. 247-253.

Primary Examiner—Norman Morgenstern
Assistant Examiner—K. Jaconethy
Attorney, Agent, or Firm—Birgit E. Morris; Donald S. Cohen; William J. Burke

[57] ABSTRACT

A photodetector including a light transmissive electrically conducting layer having a textured surface with a semiconductor body thereon. This layer traps incident light thereby enhancing the absorption of light by the semiconductor body. A photodetector comprising a textured light transmissive electrically conducting layer of $SnO_2$ and a body of hydrogenated amorphous silicon has a conversion efficiency about fifty percent greater than that of comparative cells. The invention also includes a method of fabricating the photodetector of the invention.

6 Claims, 10 Drawing Figures

METHOD FOR MAKING A PHOTODETECTOR WITH ENHANCED LIGHT ABSORPTION

The U.S. Government has rights in this application under Contract No. SERI Sub. XG-1-1169-1 with the Solar Energy Research Institute.

This is a division of application Ser. No. 424,137, filed Sept. 27, 1982, now U.S. Pat. No. 4,532,537.

The invention relates to a photodetector having a higher efficiency through enhanced absorption of the incident light.

BACKGROUND OF THE INVENTION

A photodetector is typically composed of a thin semiconductor body with aa semiconductor junction, for example a P-N junction, therein and with electrical contact being made to the light entry surface and the opposed, or back surface, of the body. Photodetectors typically exhibit a conversion efficiency of light energy to electrical power less than the theoretical maximum because the absorption coefficient of the body for light in a particular range of wavelengths is too small. This effect may be compensated for by using for the back electrical contact a material, such as a metal, exhibiting high reflectivity so that the transmitted light is reflected back into the body. However, most contact materials do not efficiently reflect light at this interface or may degrade the performance of the semiconductor body during subsequent processing steps in the manufacture of the photodetector. Alternatively, the light entry surface or the back surface of the photodetector, or the surface of a substrate upon which a body is deposited may be roughened using chemical etching techniques. The use of chemical etching techniques is undesirable because it introduces additional steps in the manufacture of the photodetector and the etching technique itself may degrade the performance of the photodetector.

It would thus be desirable to have a photodetector in which the absorption in the semiconductor body is increased over the range of wavelengths in which light is weakly absorbed, while at the same time minimizing the number of steps needed to manufacture the device and reduce the undesirable side effects, such as degradation of performance, which the additional processing may cause.

SUMMARY OF THE INVENTION

The invention is a photodetector comprising a light transmissive electrical contact having a textured surface and a semiconductor body overlying the textured surface of the light transmissive electrical contact. The surface texture of the light transmissive electrical contact is characterized in that it has a dominant peak-to-valley roughness greater than about 100 nanometers (nm).

The invention also includes a method of fabricating the photodetector of the invention which includes depositing the light transmissive electrical contact with the properly textured surface on the substrate by chemical vapor deposition from an atmosphere which contains tin, oxygen and hydrogen.

DETAILED DESCRIPTION OF PREFERRED EMBODIMENTS

Figure 1:
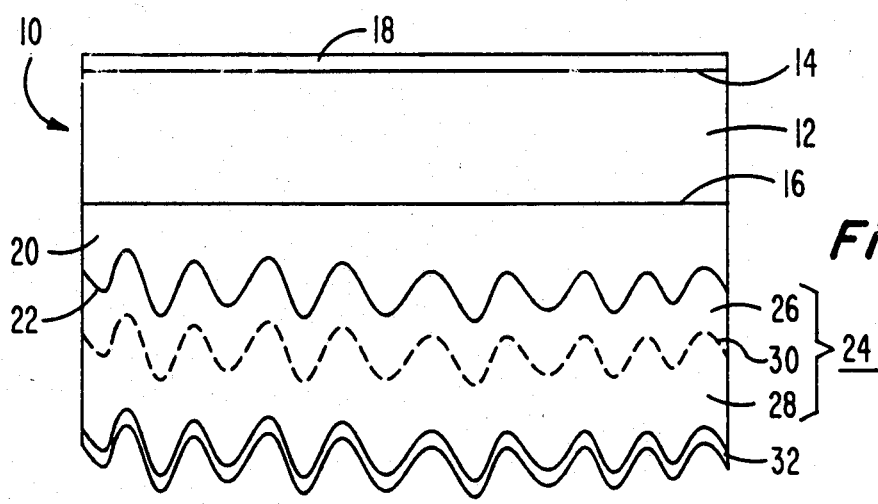
FIGS. 1–3 are cross-sectional views of three different embodiments of the photodetector of the invention.

In FIG. 1 a photodetector 10 is shown to include a light transmissive substrate 12 having first and second opposed major surfaces 14 and 16. An antireflection coating 18 overlies the first major surface 14, which is the light entry surface of the photodetector. A light transmissive electrical contact 20 having a textured surface 22 overlies the second major surface 16 of the substrate 12. A semiconductor body 24 overlies the textured surface 22 and contains regions 26 and 28 of opposite conductivity type with a semiconductor junction 30 therebetween. A second electrical contact 32 overlies the surface of the semiconductor body 24.

In the remaining FIGURES the identification of the elements common to these FIGURES and to FIG. 1 is the same.

Figure 2:
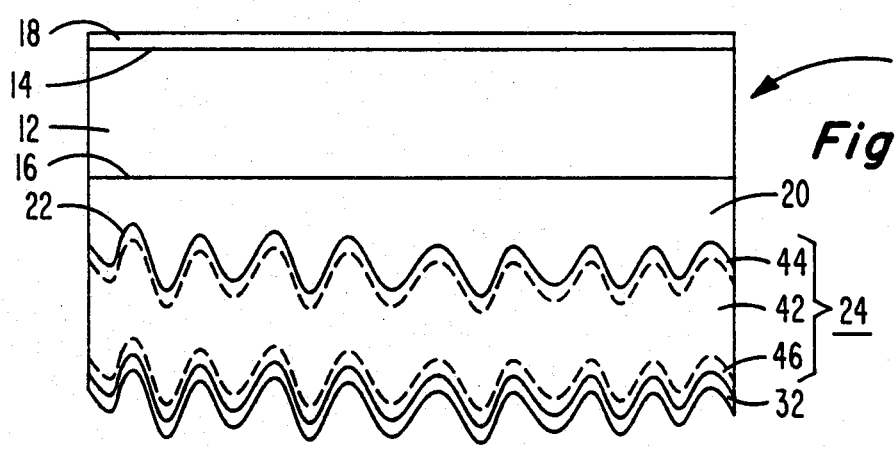

In FIG. 2 the photodetector 40 is shown to include a body 24 having an intrinsic type conductivity region 42 and regions of opposite conductivity type 44 and 46 thereby forming a P-I-N semiconductor junction across the region 42 of intrinsic conductivity type.

Figure 3:
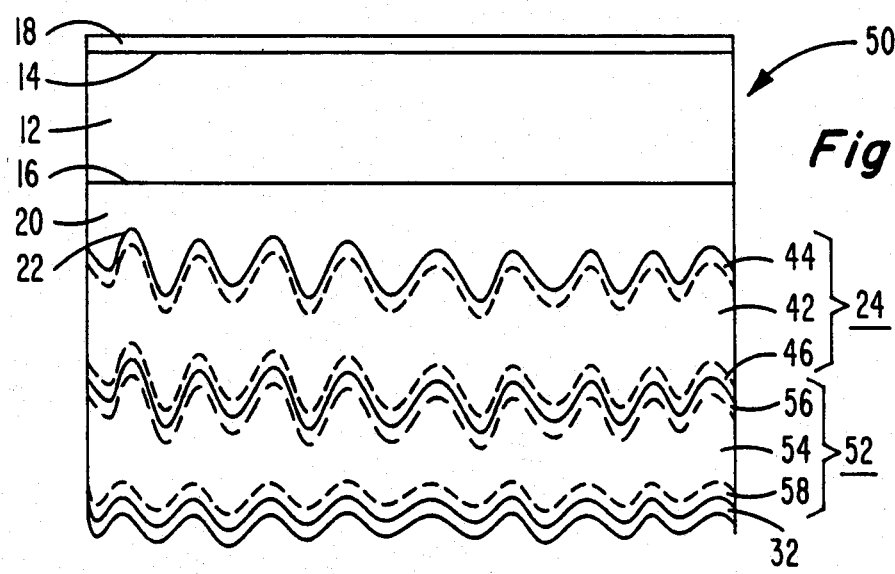

As shown in FIG. 3 a series-connected tandem photodetector 50 incorporating the invention differs from the photodetector 40 of FIG. 2 in that a tandem semiconductor body 52 is interposed between the body 24 and the second electrical contact 32. The tandem body 52 has a semiconductor junction therein which includes a region 54 of intrinsic conductivity type and opposed regions 56 and 58 of opposite conductivity type. The region 56 of the tandem body 52 and the adjacent region 46 of the body 24 are of opposite conductivity type with a tunnel junction therebetween. The tandem body 52 is typically composed of a material having a lower bandgap energy than that of the body 24 so that light which passes through the weakly absorbing body 24 is then absorbed in the tandem body 52. Typically, in a photodetector operating as a solar cell, the body 24 is composed of hydrogenated amporphous silicon and the tandem body 52 is composed of an hydrogenated amorphous Si-Ge alloy. The relative thicknesses of the body 24 and the tandem body 52 and their compositions are adjusted so that the photogenerated electrical currents for each body are the same.

The substrate 12 through which light enters the body 24 is composed of a light transmissive material such as glass having sufficient mechanical strength to support the remainder of the structure. The surface 16 of the substrate 12 upon which the light transmissive electrical contact 20 is deposited is typically a smooth, specularly reflecting surface. Typically, the substrate 12 is between about 1 and 6 millimeters (mm) thick.

The electrical contact 20 is substantially light transmissive but not transparent over the wavelength range from about 400 to 1000 nm, and has a randomly textured, non-specular surface which results in a milky white appearance of the substrate with the contact thereon and may be composed of a material such as tin-oxide or indium-tin oxide. The surface texture is characterized by dominant local peak-to-valley variations in height greater than about 100 nm, typically between about 100 and 1000 nm and preferably in the range between about 200 and 500 nm. By dominant it is meant that local regions of the surface may have a peak-to-valley roughness which is greater or less than that described above but that a majority of the surface has a roughness within the prescribed range. I have observed that the magnitude of the surface roughness increases with increasing layer thickness. To obtain a useful surface roughness the thickness of the light transmissive electrical contact should be greater than about 250 nm and is preferably less that about 1000 nm.

A layer 20 of $SnO_2$ may be deposited by chemical vapor deposition (CVD) onto a substrate heated to a temperature greater than about 350° C., typically to a temperature between about 450° C. and 550° C., from an atmosphere which includes tin, oxygen, hydrogen, and a suitable conductivity modifying dopant such as fluorine or antimony. The higher the temperature at which the deposition occurs, provided it is less than the temperature at which the substrate softens, the greater the texture. We believe that the presence of chlorine, typically in the form of HCl, in the atmosphere is also useful as a transport agent for promoting the growth of the textured surface. The source of the tin may be a tin-halogen compound, preferably $SnCl_4$, or an organo-tin compound, such as n-butyl trichlorotin, dibutyl tin diacetate or tetramethyl tin. Thin layers deposited by this process exhibit little texture or light scattering. For thicknesses greater than about 250 nm the surface texture and light scattering increase dramatically with increasing thickness. Layers which are deposited from an atmosphere containing tetramethyl tin in the absence of chlorine exhibit very little light scattering but become textured with the addition of a sufficient concentration of a halogen, such as chlorine, to the atmosphere from which the layer is deposited.

X-ray analysis shows that smooth layers and layers deposited using well known spraying techniques consist of grains of tetragonal cassiterite ($SnO_2$) having their c-axes oriented parallel to the substrate surface. For the textured layers of the invention, the grains also consist of tetragonal cassiterite but do not have the same degree of orientation to the substrate surface. Their c-axes are predominantly oriented at an angle to the substrate surface. A smooth $SnO_2$ layer having thicknesses of about 500 nm had a crystallite size of about 325 nm. A sprayed layer of comparable thickness had a crystallite size of about 174 nm. A layer of comparable thickness deposited according to the CVD method described herein had a crystallite size of about 101 nm. Thus, layers having a smaller grain size exhibit a greater surface roughness. We believe that this is due to the lack of a preferred crystallographic orientation of the grains.

Figure 4:
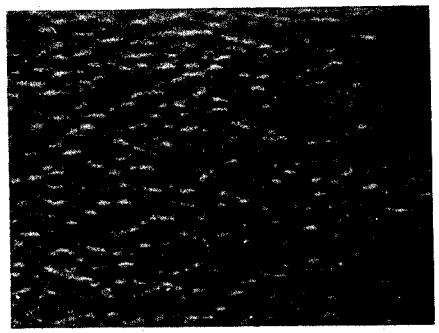
FIG. 4 is a scanning electron photomicrograph of a tin oxide surface which has been deposited by spraying techniques.
Figure 5:
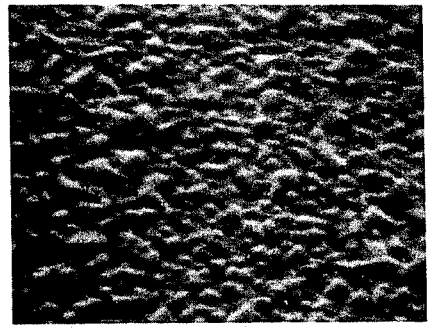
FIG. 5 is a scanning electron photomicrograph of the surface of the tin oxide layer of FIG. 4 with an additional tin oxide layer thereon.
Figure 6:
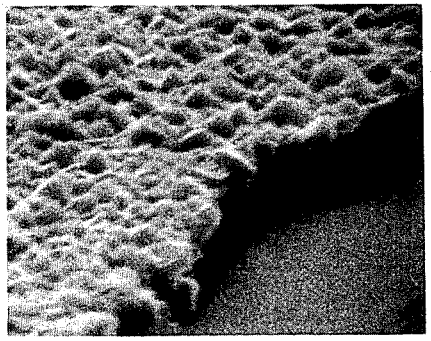
FIGS. 6 and 7 are scanning electron photomicrographs of textured tin oxide surfaces deposited according to the method of the invention.
Figure 7:
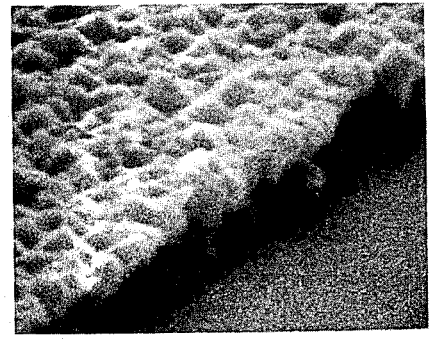

FIG. 4 is a scanning electron photomicrograph of a $SnO_2$ layer deposited by spraying techniques. FIG. 5 is a scanning electron photomicrograph of a $SnO_2$ layer deposited by spraying techniques with an additional smooth $SnO_2$ layer deposited thereon. FIG. 6 is a scanning electron photomicrograph of an about 890 nm thick $SnO_2$ layer fabricated according to the method of the invention. FIG. 7 is a scanning electron photomicrograph of an about 1200 nm thick $SnO_2$ layer fabricated according to the method of the invention. FIGS. 4 and 5 were made at 20,000 times magnification and a viewing angle of 50° while FIGS. 6 and 7 were made at the same magnification but at a viewing angle of 75°. The photomicrographs show the significantly enhanced texture of the $SnO_2$ surface deposited by the CVD method of the invention. From these photomicrographs we estimate that the texture has a characteristic peak-to-valley value between about 200 and 500 nm.

The body 24 includes any semiconductor material which can be deposited onto the textured surface of the light transmissive electrical contact 20 and may include gallium arsenide, indium phosphide, cadmium sulfide, or single crystal, polycrystalline, or hydrogenated amorphous silicon which is absorptive of light in the wavelength range of interest. The body 24 may be formed by spraying techniques or by liquid or vapor phase deposition techniques.

An amorphous silicon semiconductor body may be deposited on a substrate by DC or RF glow discharge techniques as disclosed by Carlson in U.S. Pat. No. 4,064,521, incorporated herein by reference. The substrate with the textured light transmissive contact thereon is held at a temperature typically between about 200° and 350° C., in a plasma chamber. The atmosphere in the chamber typically contains $SiH_4$ and, if desired, a suitable conductivity modifying dopant gas such as $PH_3$ or $B_2H_6$ at a total pressure typically between 0.1 and 5 torr. Other gases such as $NH_3$ or $CH_4$ may also be introduced into the chamber if one desires to deposit Si-N or a Si-C alloy such as that disclosed by Pankove in U.S. Pat. No. 4,109,271, incorporated herein by reference. In addition it may be useful to incorporate halogen atoms, such as fluorine, into the amorphous silicon. This may be done by adding a halogen containing gas such as $SiF_4$ to the chamber. For the tandem body of FIG. 3 the Si-Ge alloy may be deposited from a glow discharge containing $SiH_4$ and $GeH_4$.

The regions of opposite conductivity type 44 and 46 are typically between about 5 and 40 nm thick. Typically, the region 44 has p-type conductivity and is about 12 nm thick. This layer may be composed of hydrogenated amorphous silicon or preferably of an hydrogenated amorphous silicon-carbon alloy having a wider bandgap than the intrinsic type conductivity layer 42. Typically, the region 46 has n-type conductivity and is about 30 nm thick.

I have discovered that a continuous p-type layer 44 about 12 nm thick can be deposited on the textured surface of the light transmissive electrical contact 20. This is a remarkable result in that the surface has a predominant peak-to-valley roughness between about 200 and 400 nm and has lateral dimensions of the same magnitude. Any discontinuities in this layer may degrade the detector performance.

The intrinsic type conductivity of the region 42 is understood to include those cases where the region 42 has a small p or n-type conductivity or is compensated either as a result of accidental contamination or intentional doping. If the intrinsic region 42 has a particular conductivity type, it is preferably of opposite conductivity type to that of the region 44 adjacent to the transparent light transmissive electrical contact 20, thereby forming the semiconductor junction at the interface between the regions 42 and 44.

Previously, the intrinsic type conductivity region 42 typically had a thickness greater than about 400 nm to ensure sufficient absorption at wavelengths greater than about 600 nm. This layer can have a thickness considerably less than 600 nm and still have a useful power conversion efficiency when deposited on the textured light transmissive electrical contact of the invention. The thickness of this layer must be greater than 50 nm and is typically between about 100 and 1000 nm. This is a remarkable result in that it offers the possibility of significantly reducing the detector thickness and thus its cost while maintaining a useful power conversion efficiency. The total thickness of the semiconductor body is typically between 100 and 1,000 nm and is preferably between 200 and 600 nm.

The semiconductor junction 30 (FIG. 1) includes any type of barrier which will cause electrons and holes generated by the absorption of light in the body to move in opposite directions. Thus, the semiconductor junction 30 may be a p-n junction with portions of the regions on either side of the junction 30 being of opposite conductivity type. Thus, in FIG. 1 the first and second regions 26 and 28 respectively are of opposite conductivity type thereby forming a p-n junction 30.

The texture of the $SnO_2$ surface is propagated through the subsequently deposited amorphous silicon. This may be a desirable feature of the process in that the textured back surface of the amorphous silicon will produce additional scattering and light trapping of weakly absorbed light which is transmitted through the amorphous silicon.

The second electrical contact 32 typically covers the surface of the semiconductor body 24 and is preferably composed of a material, such as a metal, which exhibits a high reflectivity in the wavelength range of light which impinges on the contact after transmission through the semiconductor body 24 and is typically between about 100 and 700 nm thick. Preferably, it is composed of a metal, such as aluminum, gold, copper, or silver, which may be deposited by electron beam evaporation or by sputtering. A layer of titanium may be interposed between the semiconductor body 24 and the metal to provide a diffusion barrier against the metal diffusing into the semiconductor body 24 during the subsequent processing steps.

Figure 9:
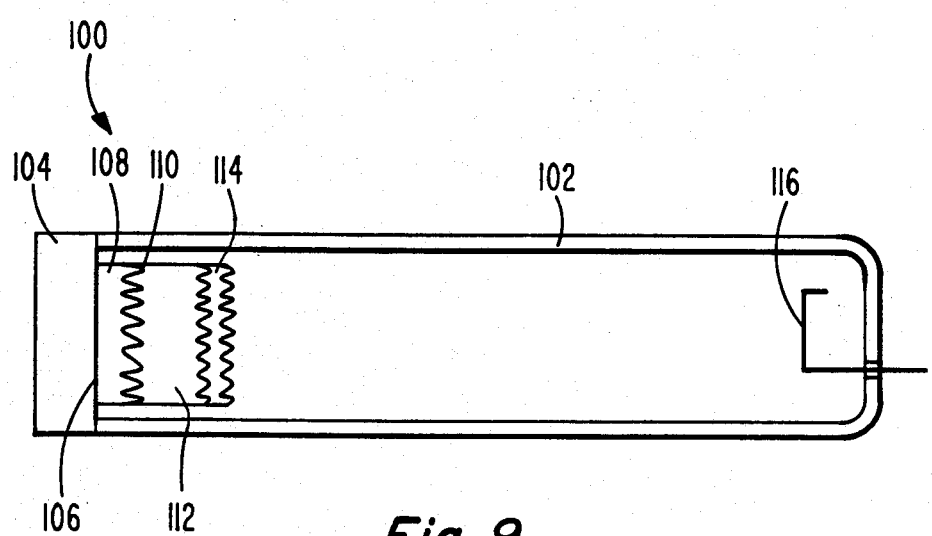
FIGS. 9 and 10 are cross-sectional views of two embodiments of the invention.

The principles of the invention may also be incorporated into a photodetector such as a thin film vidicon target, such as that disclosed by Goodman in U.S. patent application Ser. No. 399,340 filed July 19, 1982 and entitled, "HYDROGENATED AMORPHOUS SILICON TARGET HAVING A HOMOJUNCTION BEAM BLOCKING LAYER FOR USE IN AN IMAGING DEVICE", incorporated herein by reference. As shown in FIG. 9 a vidicon 100 includes an evacuated glass envelope 102 with a light transmissive faceplate 104 having a smooth major surface 106 on one end thereof. A light transmissive electrical contact 108, such as $SnO_2$, has a surface 110 opposed to the surface which overlies the surface 106 of the faceplate 104 and which is textured as described above for the photodetector 10 of FIG. 1. A light sensitive semiconductor body 112, such as hydrogenated amorphous silicon, overlies the textured surface 110 of the light transmissive electrical contact 108. The semiconductor body 112 may or may not have a semiconductor junction therein. A beam blocking layer 114 such as antimony trisulphide, overlies the semiconductor body 112. An electron gun assembly 116 is mounted inside the glass envelope 102 for forming an electron beam. Means (not shown) for focussing an electron beam generated by the gun assembly 116 and causing the beam to scan the target may be disposed outside the envelope 102.

Light enters the vidicon 100 through the faceplate 104 and is incident on the textured surface 110 of the light transmissive electrical contact 108. The incident light is scattered by the textured surface with a portion of the reflected light being trapped in the light transmissive electrical contact and with a portion of the transmitted light refracted upon entry into the overlying light sensitive body. The textured surface thus reduces reflection losses and increases the path length in the light sensitive body, thereby enhancing the light absorption.

Figure 10:
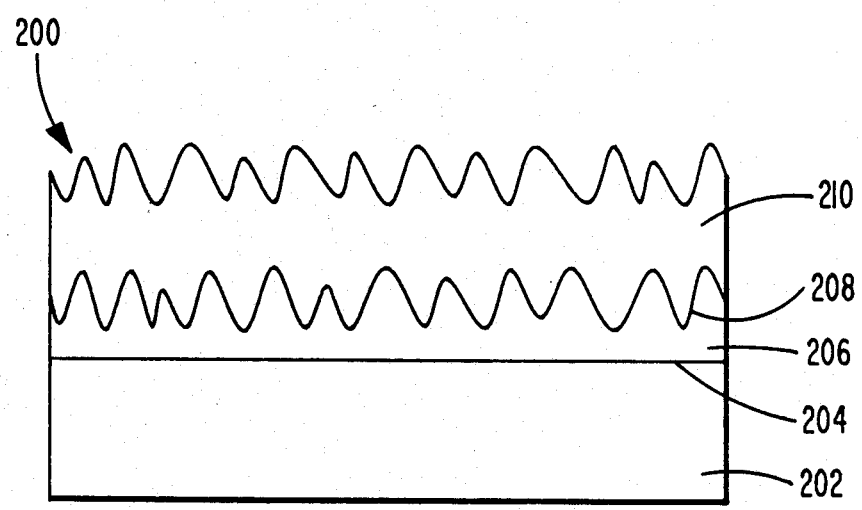

The principles of the invention may also be incorporated into a photodetector such as that used for electrophotography. As shown in FIG. 10 the photodetector 200 includes a substrate 202 having a smooth surface 204 with an electrically conducting layer 206 overlying the surface 204. The electrically conducting layer 206, such as $SnO_2$, has a surface 208 which is textured according to the principles of the invention described above. A light sensitive semiconductor body 210, such as hydrogenated amorphous silicon, overlies the textured surface 208. The semiconductor body 210 may have a semiconductor junction therein. Light enters the photodetector through a surface of the body opposed to the surface adjacent to the textured surface 208. Weakly absorbed light is transmitted through the body and is incident on the textured surface 208 where it is scattered, increasing the optical path length and thereby enhancing the optical absorption in the light sensitive body.

The invention is illustrated by the following Examples but it is not intended that it be limited to the details therein.

EXAMPLE I

Four sets of photodetectors differing from one another only in the surface texture of the light transmissive $SnO_2$ electrical contact were fabricated. Each set consisted of four hundred and forty (440) 2.27 mm square detectors and eight $48 \times 2.27$ mm detectors on a 75 mm square borosilicate glass substrate about 1.25 mm thick.

Set I had a $SnO_2$ electrical contact which had a sheet resistivity of $25\Omega/\square$ and was deposited by CVD according to the method of the invention. The glass substrate was positioned on a hot plate held at a temperature of about 500° C. The gases flowing over the substrate and their flow rates were: 3500 standard cubic centimeters per minute (sccm) of $N_2$; 350 sccm of $N_2$ bubbled through $SnCl_4$ held at room temperature; 70 ccm of $BrCF_3$ as measured by a flow meter calibrated for air flow; 200 sccm of $O_2$; and 400 sccm of $N_2$ bubbled through $H_2O$.

Set II had a $SnO_2$ electrical contact with a sheet resistivity of $25\Omega/\square$ deposited by the same method for Example I.

Set III was a commercially prepared $SnO_2$ electrical contact deposited by spraying techniques on glass and having a sheet resistivity of about $10\Omega/\square$.

Set IV is a substrate similar to Sample III with an additional 100 nm of smooth $SnO_2$ deposited by CVD from an atmosphere containing tetramethyl tin. This additional layer was deposited on the $SnO_2$ surface in an attempt to eliminate an electrical barrier which sometimes occurs at this interface.

The four sets of samples with the SnO$_2$ electrical contacts thereon were then placed together in a glow discharge chamber for the deposition of a P-I-N semiconductor body as disclosed by Carlson in U.S. Pat. No. 4,064,521. A P-type hydrogenated amorphous silicon-carbon alloy about 12 nm thick was deposited from a flowing gas atmosphere containing CH$_4$, SiH$_4$, and B$_2$H$_6$ in SiH$_4$ as disclosed by Pankove in U.S. Pat. No. 4,109,271. An intrinsic hydrogenated amorphous silicon layer about 550 nm thick was then deposited from an atmosphere containing flowing SiH$_4$. An N-type hydrogenated amorphous silicon layer about 30 nm thick was then deposited from an atmosphere containing flowing PH$_3$ in SiH$_4$.

The back electrode, consisting of a 2.5 nm thick layer of titanium and a 500 nm thick layer of silver, was deposited by electron beam evaporation and then patterned using standard photoresist and chemical etching techniques to form the individual detectors.

Each set was then annealed at 150° C. in air for 30 minutes.

The individual detectors on a substrate were probed under standard AM-1 illumination to measure the open circuit voltage $V_{oc}$, the short circuit current density $J_{sc}$, the fill factor FF, and the efficiency $\eta$, defined as the ratio of the electrical power output to the incident light power. The best results for these parameters for each set of photodetectors indicated that, for the photodetectors incorporating the rough SnO$_2$ layer of the invention, the open circuit voltage was several percent higher, the short circuit current density was about thirty percent higher and the fill factor was about eighteen percent higher. The resulting efficiency was about fifty percent greater for the photodetectors incorporating the textured SnO$_2$ layer of the invention than for the photodetectors having a spray deposited SnO$_2$ layer.

EXAMPLE II

The integrated scattered transmitted light intensity $S_t$ was measured at a wavelength of about 501.7 nm for different thickness SnO$_2$ layers deposited by the technique CVD technique of Example I using SnCl$_4$ as the tin source. The results are listed in Table II.

TABLE II

| Thickness (nm) | $S_t$ |
|---|---|
| 80. | 0 |
| 170. | 1% |
| 260. | 4% |
| 440. | 12% |
| 710. | 23% |
| 890. | 38% |
| 1200. | 48% |

The thickness was measured using a profilometer which rides along the peaks of the textured surface. Thus, the mean thickness is somewhat less than the thickness values listed.

From this data it can be seen that the light scattering and thus the texture increases with increasing thickness. The optimum thickness is not, however, that exhibiting the maximum texture or maximum light scattering since the light absorption in the SnO$_2$ coating is also increasing with increasing thickness particularly at wavelengths less than 500 nm. The optimum thickness of the textured electrical contact is between about 250 and 1000 nm and is preferably between about 300 and 800 nm.

EXAMPLE III

Figure 8:
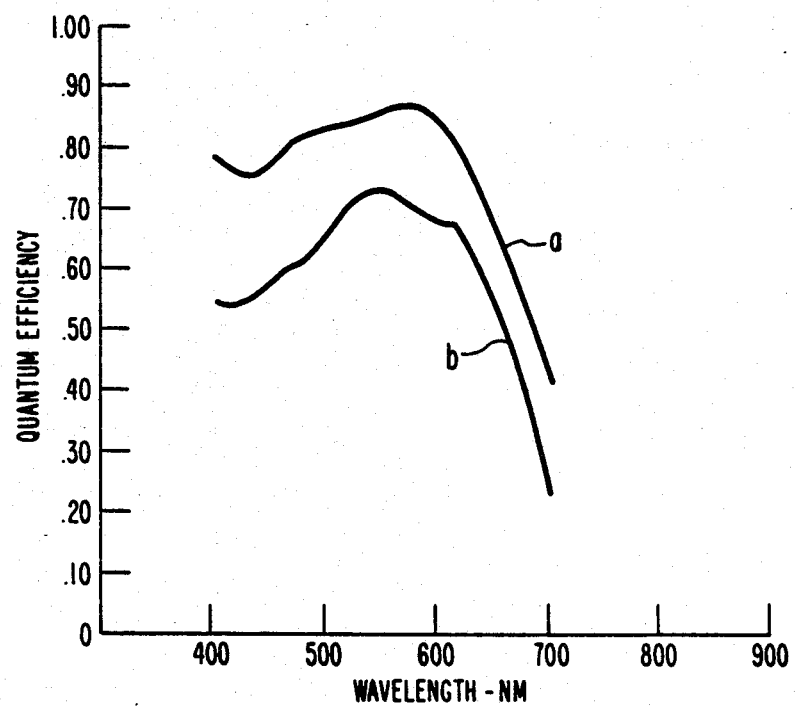
FIG. 8 is a graphical illustration of the variation in quantum efficiency for a photodetector of the invention and a comparative photodetector.

Measurements were made of the quantum efficiency, defined as the ratio of the number of carriers collected to the number of incident photons, as a function of a wavelength on 2.27 nm square detectors from Sets I and IV of Example I. These measurements are plotted in FIG. 8 where curve (a) is for a photodetector from Set I and curve (b) is for a photodetector from Set IV. The difference between the two curves arises from the incorporation of the textured surface between the SnO$_2$ light transmissive electrical contact and the amorphous silicon body and has as a magnitude of about 25% across the entire wavelength range from 400 to 700 nm. The increase in efficiency at wavelengths greater than 600 nm is unexpectedly large but is understandable in terms of an increased optical path length in the amorphous silicon. What is totally unexpected is the large increase in quantum efficiency at wavelengths less than 600 nm. This indicates improved coupling of light into the absorber since any light entering the absorber in this wavelength range is completely absorbed before it can strike the back surface of the amorphous silicon body. We believe that this improved coupling is due to light trapping in the SnO$_2$ layer itself which arises from the textured surface and which permits multiple incidences of the light on the interface with the amorphous silicon body. Thus, the textured interface produces light trapping not only in the absorber but also in the electrical contact itself. This is in distinction to previous light trapping structures where the light trapping occurred in the absorber.

Optical reflectivity measurements show that the reflectivity of the interface between the SnO$_2$ electrical contact and the amosphous silicon body is about 2.5% in this wavelength range as compared to a value of between about 12 and 16% for a smooth interface. The refractive index of the SnO$_2$ is intermediate between that of the substrate and that of the amorphous silicon body which may also be useful in enhancing the absorption in the amorphous silicon layer.

I claim:

1. A method of fabricating a photodetector comprising the steps of:
   depositing a light transmissive electrically conducting layer having roughened surface which has a dominant peak-to-valley roughness greater than about 100 nanometers and a thickness greater than about 250 nanometers by chemical vapor deposition from an atmosphere containing tin, oxygen, hydrogen, chlorine and a conductivity modifying dopant onto a surface of a substrate; and
   depositing a layer of hydrogenated amorphous silicon onto the surface of said conducting layer.

2. The method of claim 1 wherein the substrate is held at a temperature greater than about 350° C. during the deposition of said conducting layer.

3. The method of claim 2 wherein the substrate is held at a temperature between about 450° C. and 550° C. during the deposition of said conducting layer.

4. The method of claim 1 wherein said conducting layer is between about 300 and 800 nanometers thick.

5. The method of claim 1 wherein said roughened surface has a dominant peak-to-valley roughness between about 100 and 1000 nanometers.

6. The method of claim 5 wherein the dominant peak-to-valley roughness of the surface of said conducting layer is between about 200 and 500 nanometers.

* * * * *